(12) United States Patent
Kato et al.

(10) Patent No.: US 7,666,795 B2
(45) Date of Patent: Feb. 23, 2010

(54) METHOD FOR MANUFACTURING SEMICONDUCTOR DEVICE

(75) Inventors: Juri Kato, Chino (JP); Hideaki Oka, Minowa (JP); Masamitsu Uehara, Shiojiri (JP)

(73) Assignee: Seiko Epson Corporation (JP)

( * ) Notice: Subject to any disclaimer, the term of this patent is extended or adjusted under 35 U.S.C. 154(b) by 71 days.

(21) Appl. No.: 11/955,700

(22) Filed: Dec. 13, 2007

(65) Prior Publication Data

US 2008/0146035 A1    Jun. 19, 2008

(30) Foreign Application Priority Data

Dec. 19, 2006   (JP)   ............................. 2006-341646

(51) Int. Cl.
*H01L 21/302*   (2006.01)
*H01L 21/461*   (2006.01)

(52) U.S. Cl. ............... 438/718; 438/752; 257/E21.115; 257/E21.219; 257/E21.699; 216/99

(58) Field of Classification Search ................ 438/718, 438/751, 752, 749, 750; 257/E21.115, E21.223, 257/E21.219, E21.699; 216/46, 99, 108
See application file for complete search history.

(56) References Cited

U.S. PATENT DOCUMENTS

| 6,494,219 | B1 * | 12/2002 | Nayak et al. | 134/56 R |
| 7,368,340 | B2 | 5/2008 | Kato | |
| 2004/0222498 | A1 * | 11/2004 | Beintner et al. | 257/606 |
| 2005/0020085 | A1 * | 1/2005 | Lee et al. | 438/700 |
| 2005/0233545 | A1 * | 10/2005 | Henley et al. | 438/458 |
| 2006/0264008 | A1 * | 11/2006 | Delattre | 438/479 |
| 2007/0045725 | A1 * | 3/2007 | Yun et al. | 257/330 |

FOREIGN PATENT DOCUMENTS

| JP | 2005-322830 | 11/2005 |
| JP | 2005-354024 | 12/2005 |
| JP | 2006-253181 | 9/2006 |

OTHER PUBLICATIONS

T. Sakai, et al. "Separation by Bonding Si Islands (SBSI) for LSI Applications", Second International SiGe Technology and Device Meeting, Meeting Abstract, pp. 230-231 (2004).

* cited by examiner

*Primary Examiner*—Caridad M Everhart
(74) *Attorney, Agent, or Firm*—Harness, Dickey & Pierce, P.L.C.

(57) ABSTRACT

A method for manufacturing a semiconductor device includes forming a SiGe layer on a Si substrate, forming a dummy pattern to expose a surface of the Si substrate, and wet etching the SiGe layer while an etchant is contacted with, the dummy pattern.

12 Claims, 10 Drawing Sheets

METHOD FOR MANUFACTURING SEMICONDUCTOR DEVICE

The entire disclosure of Japanese Patent Application No. 2006-341646, filed Dec. 19, 2006 is expressly incorporated by reference herein.

BACKGROUND

1. Technical Field

Several aspects of the present invention relates to a method for manufacturing a semiconductor device, in particular, a technique to prevent an etching selectivity of SiGe with respect to Si from deteriorating.

2. Related Art

A field-effect transistor formed on a silicon-on-insulator (SOI) substrate has been drawing attention recently because of its usability in terms of easy-element isolation, latch-up free, and small source/drain junction capacitance. Especially, since a fully depleted SOI transistor enabling low power consumption and high-speed operation is easy to drive at a low voltage, researches to drive an SOI transistor in a fully depleted mode are actively carried out. A method capable of manufacturing an SOI transistor economically by forming an SOI layer on a bulk substrate (i.e. Separation by Bonding Si islands (SBSI) is disclosed In JP-A-2005-354024 and *Separation by Bonding Si islands (SBSI) for LSI Applications.* (T, Sakai et al.), Second International SiGe Technology and Device Meeting, Meeting Abstract, pp. 230-231, May (2004). In SBSI, after Si and SiGe layers are formed on a Si substrate, only the SiGe layer is selectively removed by using a difference in etching rates between Si and SiGe so as to form, a cavity between the Si substrate and the Si layer. Then, a $SiO_2$ layer is embedded between the Si substrate and the Si layer by thermally oxidizing the Si exposed in the cavity, forming a BOX layer between the Si substrate and the Si layer.

In the SBSI described above, a process to selectively remove a SiGe layer is important to obtain a stable process yield and a high yield of electric characteristics. In a manufacturing method in related art, a logic circuit and a memory circuit have a plane pattern of an active layer (SOI layer) that is less various in size and density, thereby providing a stable process yield and electric characteristics.

However, in a circuit, having a bulk silicon device and an SOI device mounted in combination, and in a circuit including devices having various driving voltages and being mounted in combination, differences in area and density between plane patterns of the SOI layers are generally large. Here, in the manufacturing method in related art, an etching speed of SiGe layer is deteriorated (that is slowed down) depending on a spot due to high or low density of the patterns. Further, especially, when an etching time is longer, an etching speed of Si becomes faster.

That is, in the manufacturing method in related art, when a semiconductor having various devices such as a bulk silicon device and an SOI device mounted in combination is manufactured, an etching selectivity of a SiGe layer with respect to a Si layer is partially deteriorated. Therefore, it is hard to form an SOI layer with a large area having a stable shape and an even film thickness, or an SOI layer into various shapes with high yields. As the above, the manufacturing method in related art has been required to improve a process yield and stabilize electrical characteristics of a semiconductor having various devices described above mounted in combination.

SUMMARY

An advantage of the present invention is to provide a method for manufacturing a semiconductor device in which an etching selectivity of SiGe with respect to Si is prevented from deteriorating when SiGe formed on Si is etched.

Regarding selective etching of SiGe with hydrofluoric-nitric acid, the inventors performed various experiments. As a result, a selective etching mechanism in which SiGe serves as an anode while Si serves as a cathode in the selective etching as above, and SiGe is removed by an electrochemical reaction such as one shown in FIG. 10 has been discovered.

That is, the inventors consider that "deterioration of an etching selectivity" is caused by reduction of oxidation number of SiGe due to insufficient supply of holes to a SiGe layer when SiGe is selectively etched, or increase of oxidation number of Si in a Si layer. In the etching process, by $HNO_3$ and HF molecules reaching to a surface of the SiGe layer, the SiGe layer becomes a $H_2Si$ (or Ge)$F_6$ reaction product at an interface of the SiGe layer/an etchant, and then is removed. Here, when Si or Ge is represented by IV (group), the removal reaction thereof is shown as a formula 1.

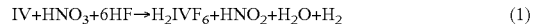

$$IV + HNO_3 + 6HF \rightarrow H_2IVF_6 + HNO_2 + H_2O + H_2 \quad (1)$$

In this reaction, $HNO_3$ serves as an oxidizer, forming an oxide IVO2 on the surface of the SiGe layer, while HF works to dissolve the oxide. Here, when SiGe and Si are deposited as layers on the Si substrate, as shown in FIG. 11, holes migrate from a wide gap (Si) to a narrow gap (SiGe) at the interface between SiGe and Si. Accordingly, the holes accumulate at the narrow gap (SiGe) side, matching a chemical potential (Fermi level) of SiGe with that of Si. Here, a gap indicates a difference between an energy level Ec in a conduction band and an energy level Ev in a valence band, that is, a band gap Eg(=Ec−Ev). Further, i-Si in the figure indicates an intrinsic Si layer while i-SiGe indicates an intrinsic SiGe layer.

As shown in FIG. 11, at a contact interface between i-SiGe and i-Si, the energy level difference ΔEv (up to 0.3V) in the valence bands of both the layers is greater than the energy level difference ΔEc (up to 0V) in the conduction bands of both the layers. Therefore, a positive charge is easy to transfer from the Si layer to the SiGe layer, thereby the SiGe layer includes more positive charges than the Si layer. Therefore, as shown in FIG. 10, the oxidation number in the SiGe layer is large at the interface between the SiGe layer and the etchant, and the SiGe layer electrically behaves as an anode electrode, supplying holes as $IV^{++}$ to the etchant (hereinafter, also referred to as "solution") as shown by formulae 2 through 4. Further, if the Si substrate is made to be in a P-type, migration of the holes from Si to SiGe is increased more, enhancing the oxidation number in the SiGe layer.

$$IV + 2h^+ \rightarrow IV^{++} \quad (2)$$

$$IV^{++} + 2OH^- \rightarrow IVO_2 + H_2 \quad (3)$$

$$IVO_2 + 6HF \rightarrow H_2IVF_6 + 2H_2O \quad (4)$$

On the other hand, the Si layer includes a relatively large number of negative charges. At the interface between the Si layer and the solution, the Si layer electrically behaves as a cathode electrode, supplying electrons as $NO^{2-}$ to the solution as shown by formulae 5 through 6.

$$Si + 2e \rightarrow Si^{--} \quad (5)$$

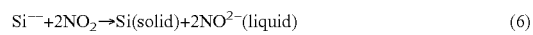

$$Si^{--} + 2NO_2 \rightarrow Si(solid) + 2NO^{2-}(liquid) \quad (6)$$

Therefore, when the SiGe layer is selectively etched, as shown in FIG. 10, the SiGe layer serves as an anode while the Si layer serves as a cathode, making an electric current (the hole h+) circulate through the etchant, the Si layer, SiGe layer, the etchant and so on in this order. Accordingly, to improve the etching selectivity for selectively etching the SiGe layer, following a and b are important.

a) To increase the oxidation number (the number of excessive holes) in the SiGe layer b) To replace $Si^{++}$ holes taken out in the solution in response to etching of the SiGe layer with ones from the Si layer and the Si substrate Further, in a multilayer structure including the Si layer, the SiGe layer (a Ge concentration of 37%, a thickness of 30 nm), and the Si substrate, the etching rate of the SiGe layer exceeds 0.01 μm/second. This means that a current flowing per unit area at the interface between the SiGe layer and the solution reaches several tens of $mA/cm^2$. Therefore, to ensure a high etching speed and a high selectivity, a route shown above (that is, through the etchant, the Si layer, the SiGe layer, and the etchant and so on in this order) requires a path for a large current circulating, thereby following c and d are important.

c) To ensure an electric current path at the interfaces between the Si layer and the solution, and between the Si substrate and the solution d) To secure an electric current path at the interface between the Si layer and the solution The present invention is based on such information.

A method for manufacturing a semiconductor device according to a first aspect of the invention includes forming a SiGe layer on a Si substrate, forming a dummy pattern to expose a surface of the Si substrate, and wet etching the SiGe layer while an etchant is contacted with the dummy pattern.

A method for manufacturing a semiconductor device according to a second aspect of the invention includes forming a SiGe layer on a Si substrate, forming a Si layer on the SiGe layer, partially etching the Si layer and the SiGe layer so as to form a groove to expose a side surface of the SiGe layer, forming a dummy pattern to expose at least one of a surface of the Si substrate and a surface of the Si layer; and wet etching the SiGe layer through the groove while an etchant is contacted with the dummy pattern so as to form a cavity between the Si substrate and the Si layer.

In the aspects above, the Si substrate may include a region where a bulk silicon device is formed and a region where an SOI device is formed, and the dummy pattern maybe formed in at least one of the region where the bulk silicon device is formed, the region where the SOI device is formed, and a scribe line region.

Here, "bulk silicon device" indicates an electronic device to be formed on a bulk Si substrate. Meanwhile, an "SOI device" indicates an electronic device to be formed on a Si layer (that is an SOI layer) formed on an insulating film. In the embodiments, the region where the bulk silicon device is formed is called a bulk region, while the region where the SOI device is formed is called an SOI region.

In the aspects above, since the dummy pattern is provided, the contact interface between Si and the etchant is made sufficiently broad, thereby circulating an electric current (hole h+) required to etch the SiGe layer through the etchant, the Si substrate (or the Si layer), the SiGe layer, the etchant, and so on in this order. Therefore, an etching selectivity of SiGe with respect to Si is prevented from deteriorating. According to the above, the SiGe layer is etched at a high etching speed and a high selectivity regardless of various sizes and density of the area of the SOI layer pattern, for example.

In the aspects above, the etchant may be made of a mixed solution including one of HF and $NH_4F$; $HNO_3$; and $H_2O$. The mixed solution may be supplied to the dummy pattern and the SiGe layer, while a temperature of the mixed solution is at 50 degrees centigrade or more. Here, "a mixed solution including HF, $HNO_3$ and $H_2O$" is also called as a hydrofluoric-nitric acid solution.

In the aspects above, the etchant may be made of a mixed solution including: $CH_3COOH$; one of HF and $NH_4F$; $HNO_3$; and $H_2O$. The mixed solution may be supplied to the dummy pattern and the SiGe layer, while a temperature of the mixed solution is at 50 degrees centigrade or more.

According to the above, controlling the temperature to be at 50 degrees centigrade or more allows the large current to flow at the interface between the SiGe and the Si substrate (or the Si layer). Therefore, the large electric current can circulate through the etchant, the Si substrate (or the Si layer), the SiGe layer, the etchant, and so on in this order. When the Si substrate is an N-type substrate, the electric current at the interface between the SiGe and the Si is supplied in a reverse direction. However, even in this case, a leak current in the reverse direction is greatly provided due to the high temperature, securing an ability of supplying holes to the SiGe layer.

In the aspects above, the SiGe layer may be etched with an etchant in which each of a plurality of constituents included therein is stored in a single state, and mixed together within five minutes immediately before the etching. The etchant may he adjusted to be at a predetermined temperature in order to supply from a nozzle to the surface of the Si substrate being rotating.

According to the above, the etchant is prevented from deteriorating. Further, for example, in the above, when $CH_3COOH$, HF, $HNO_3$ and $H_2O$ are mixed, the temperature of the mixed solution rises to 40 to 50 degrees centigrade. Therefore, when the mixed solution is heated to be at 50 degrees centigrade or more, an amount of heat required for controlling the temperature can be reduced, resulting in energy saving.

In the aspects above, the SiGe layer may be wet etched by alternately supplying the etchant and one of pure water, a dilute HF solution, and a hydrogen peroxide solution from a nozzle toward the surface of the Si substrate being rotating.

According to the above, for example, before a concentration of nitrous acid in the hydrofluoric-nitric acid solution is increased, an old hydrofluoric-nitric acid solution is removed once. Thereafter, the hydrofluoric-nitric acid solution newly formed is supplied again so as to etch the SiGe layer. Therefore, the concentration of nitrous acid in the hydrofluoric-nitric acid solution and a product generated by etching are easily maintained to be less than or equal to a constant concentration, more assuredly preventing the etching selectivity from deteriorating and preventing a speed to etch the Si layer from increasing.

In the aspects above, the SiGe layer may be wet etched while the Si substrate has a temperature of 50 degrees centigrade or more by being heated. According to the method as above, the large electric current is supplied at the interlace between the SiGe and the Si substrate (or the Si layer), and allowed to circulate through the etchant, the Si substrate (or the Si layer), the SiGe layer, the etchant, and so on in this order.

BRIEF DESCRIPTION OF THE DRAWINGS

The invention will, be described with reference to the accompanying drawings, wherein like numbers reference like elements.

FIG. 9 is a diagram showing an example configuration of dummy patterns DP1, DP2, and the like.

DESCRIPTION OF EXEMPLARY EMBODIMENTS

The embodiments of the invention will now be described with reference to the accompanying drawings.

Embodiments

FIGS. 1A through 8C are diagrams showing a method for manufacturing a semiconductor device according to an embodiment of the invention. FIGS. 1A through 8A are plan views. FIGS. 1B through 8B are sectional views taken along the lines A1-A1' to A8-A'8 of FIGS. 1A through 8A, respectively. Further, FIG. 6C through 8C are sectional views taken along the lines B6-B'6 to B8-B'8 of FIGS. 6A through 8A, respectively.

Figure 1A:
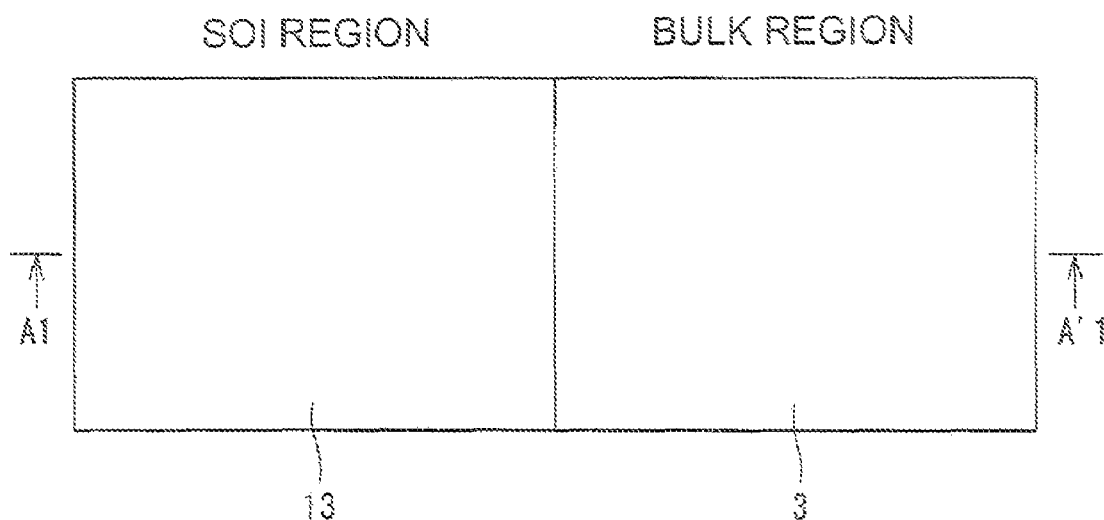
FIGS. 1A and 1B are diagrams illustrating a method for manufacturing a semiconductor device according to an embodiment.
Figure 1B:
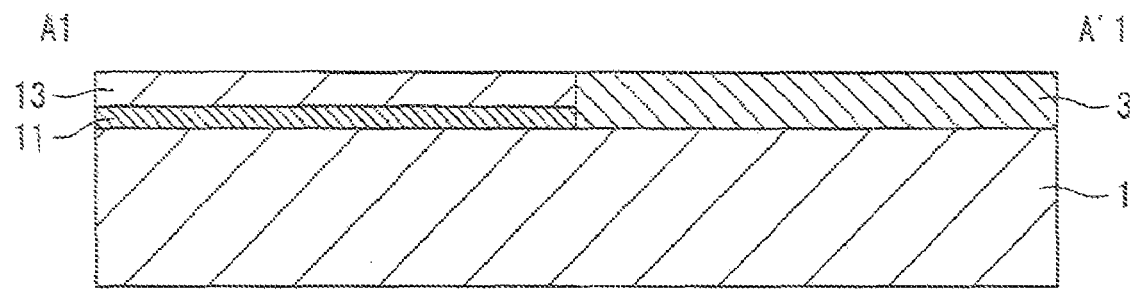

First, as shown in FIGS. 1A and 1B, a silicon oxide ($SiO_2$) film 3 is formed on a whole surface of a Si substrate 1. The $SiO_2$ film is formed by chemical vapor deposition (CVD), for example. Then, as shown in FIGS. 1A and 1B, the $SiO_2$ film 3 is removed from the Si substrate 1 of an SOI region by photolithography and etching so as to expose the surface of the substrate. At this time, the $SiO_2$ film 3 remains on the Si substrate 1 in a bulk region. Next, a single-crystalline silicon-buffer (Si-buffer) layer which is not shown is formed on the Si substrate 1 in the SOI region, followed by a single-crystalline silicon-germanium (SiGe) layer 11, and a single-crystalline silicon (Si) layer 13 sequentially formed on top thereof. The Si-buffer layer, the SiGe layer 11, and the Si layer 13 are sequentially formed by selective epitaxial growth, for example.

Figure 2A:
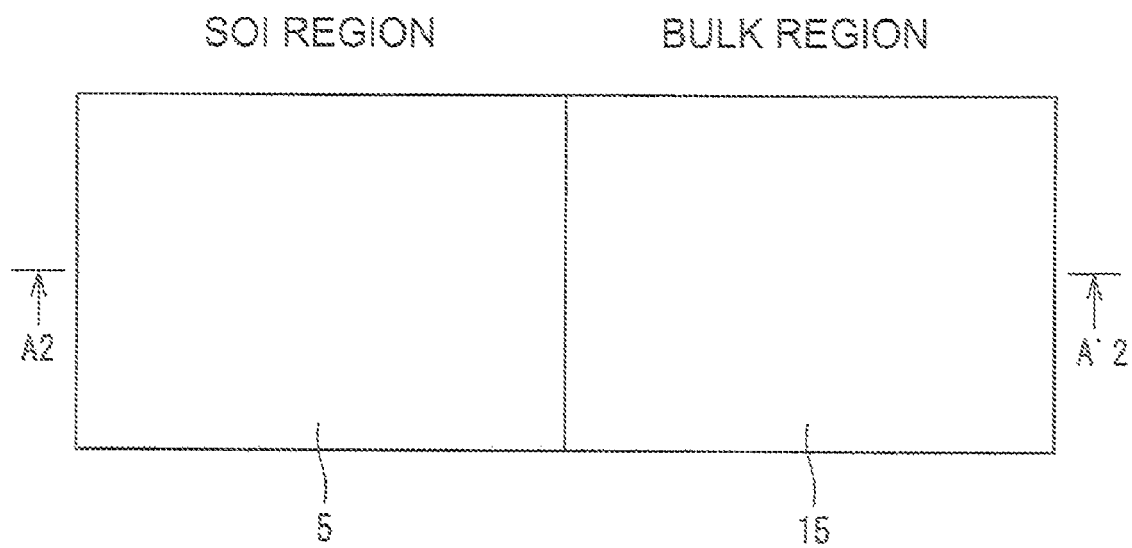
FIGS. 2A and 2B are diagrams illustrating the method for manufacturing a semiconductor device according to the embodiment.
Figure 2B:
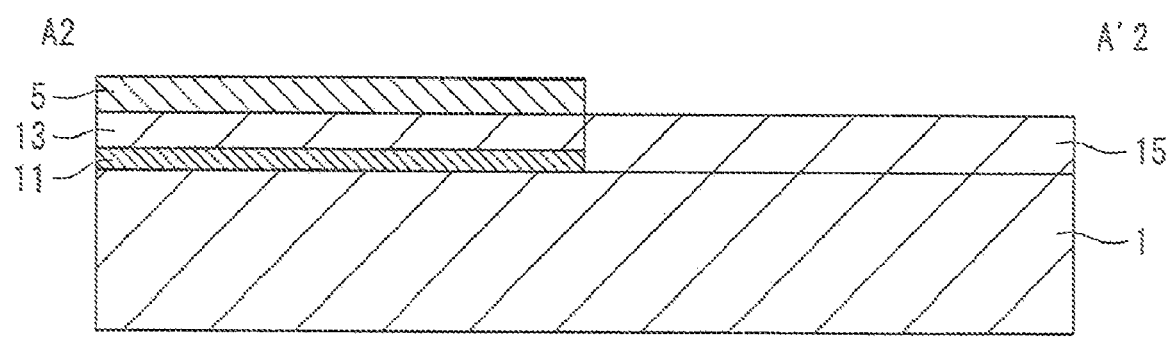

Next, a $SiO_2$ film 5 (See FIGS. 2A and 2B) is formed on the whole surface of the Si substrate 1. The $SiO_2$ film 5 is formed by CVD, for example. Then, the $SiO_2$ films 3 and 5 in the bulk region are removed by photolithography and etching so as to expose the surface of the substrate. At this time, the $SiO_2$ film 5 remains in the SOI region. Next, as shown in FIGS. 2A and 2B, a single-crystalline Si layer 15 is formed on the Si substrate 1 in the bulk region. The Si layer 15 is formed by selective epitaxial growth, for example. After the Si layer 15 is formed, the $SiO_2$ film 5 remaining in the SOI region is removed by etching.

Figure 3A:
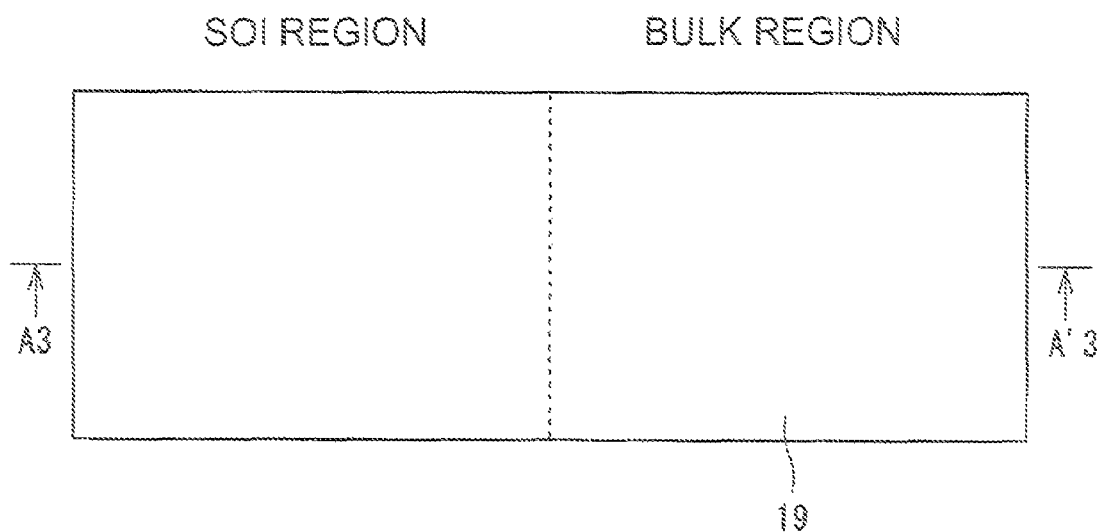
FIGS. 3A and 3B are diagrams illustrating the method for manufacturing a semiconductor device according to the embodiment.
Figure 3B:
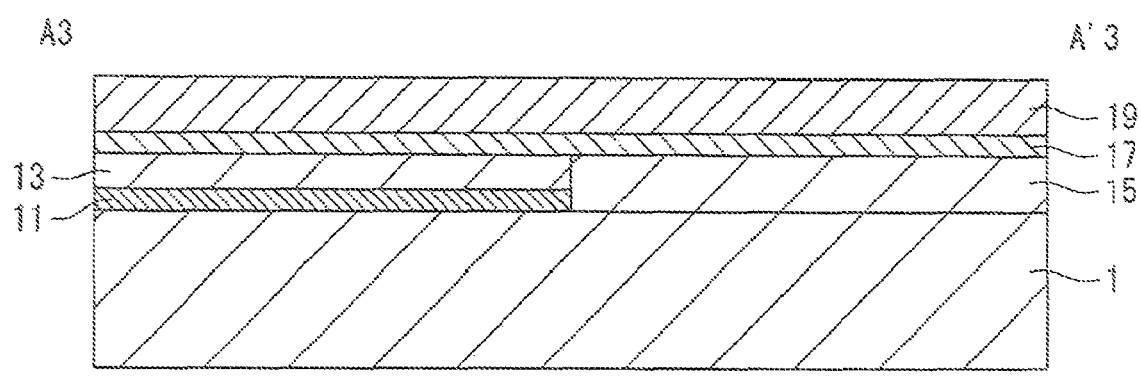
Figure 4A:
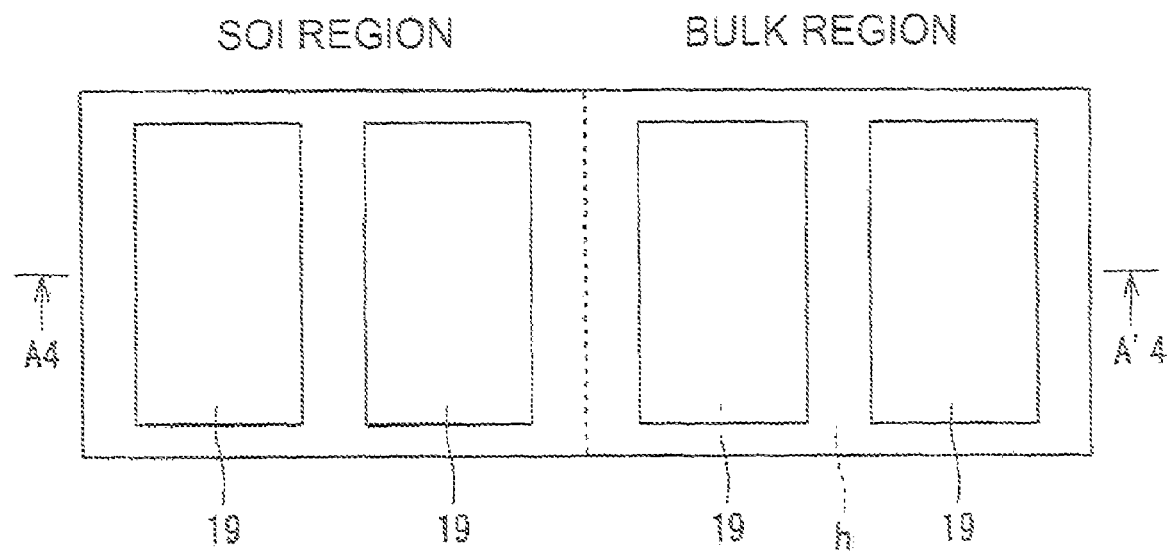
FIGS. 4A and 4B are diagrams illustrating the method for manufacturing a semiconductor device according to the embodiment.
Figure 4B:
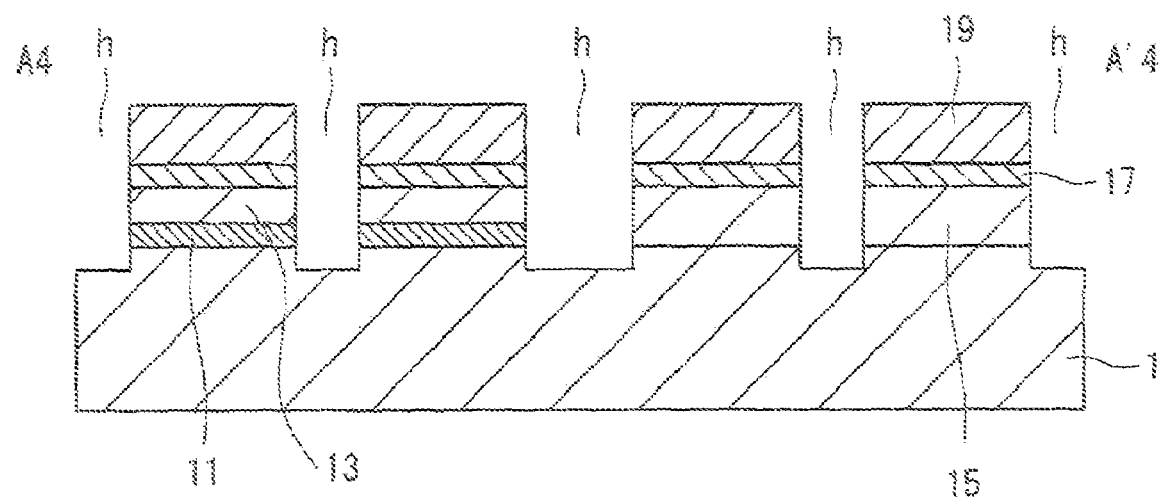

Next, as shown in FIGS. 3A and 3B, a $SiO_2$ layer 17 is formed on a whole of the upper surface of the Si substrate 1, followed by a silicon nitride ($Si_3N_4$) film 19 formed on top thereof. The $SiO_2$ film 17 and the $Si_3N_4$ film 19 are formed by CVD, for example. Next, as shown in FIGS. 4A and 4B, the $Si_3N_4$ film 19, the $SiO_2$ film 17, the Si layer 13, the SiGe layer 11, and the Si-buffer layer (not shown) in the SOI region are partially etched while the $Si_3N_4$ film 19, the $SiO_2$ film 17, and the Si layer 15 in the bulk region are partially etched. Accordingly, a depressed portion h serving as a support and having the Si substrate 1 as a bottom surface thereof is formed in a region that is overlapped, with an element isolation region (that is, a region where the SOI structure is not to be formed) in plan view. In the etching step, etching may be performed until reaching the surface of the Si substrate 1, or the substrate 1 may be overetched to form a concave thereon.

Figure 5A:
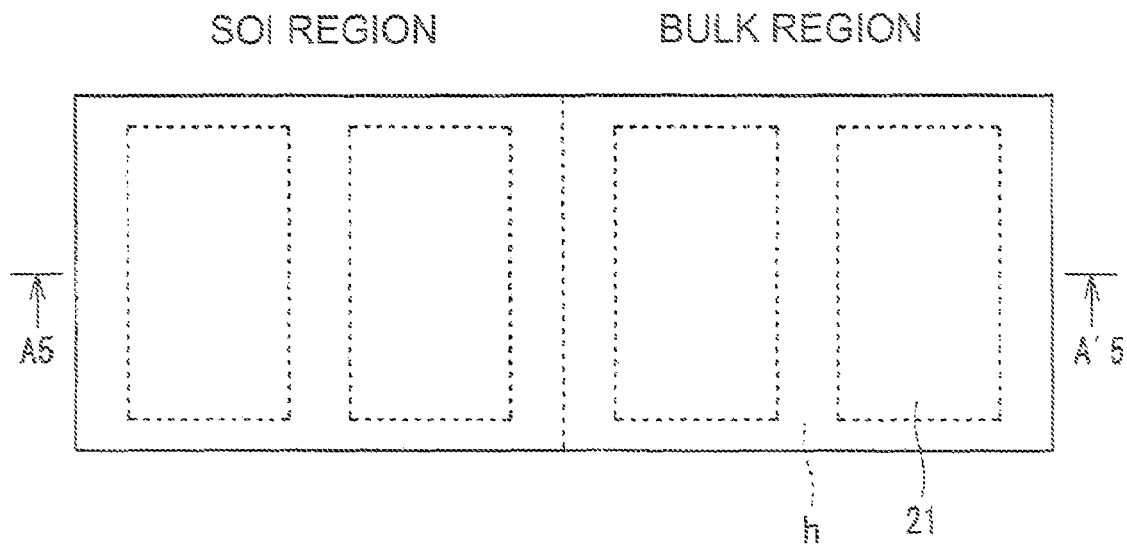
FIGS. 5A and 5B are diagrams illustrating the method for manufacturing a semiconductor device according to the embodiment.
Figure 5B:
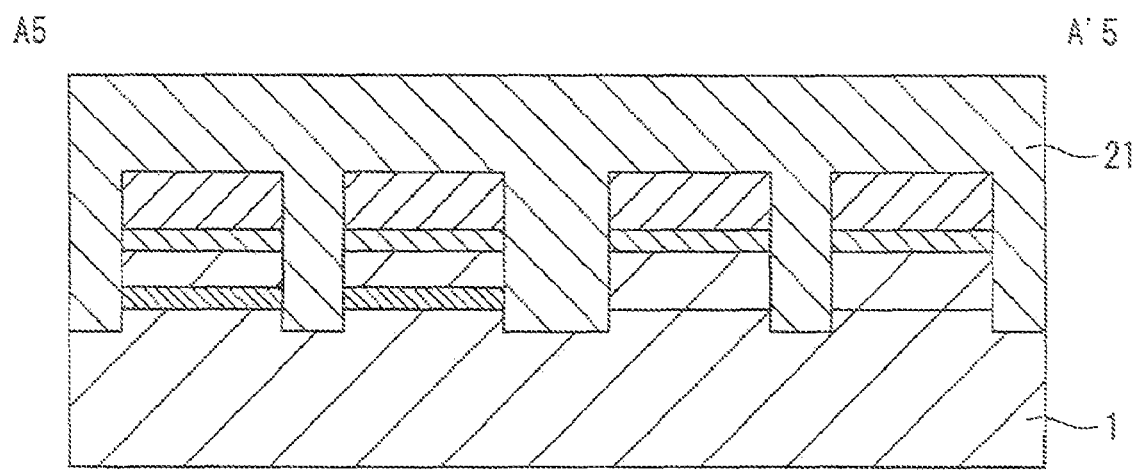
Figure 6A:
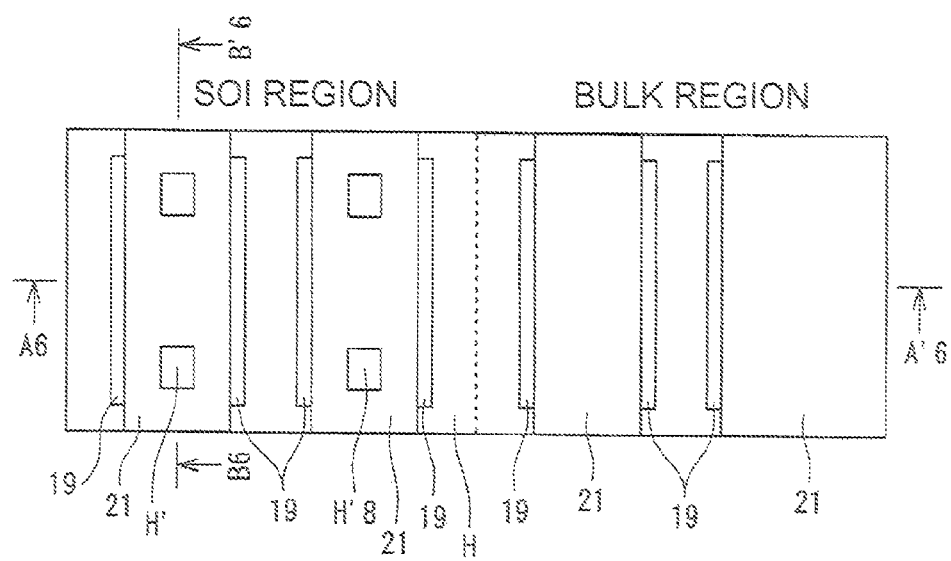
FIGS. 6A through 6C are diagrams illustrating the method for manufacturing a semiconductor device according to the embodiment.
Figure 6B:
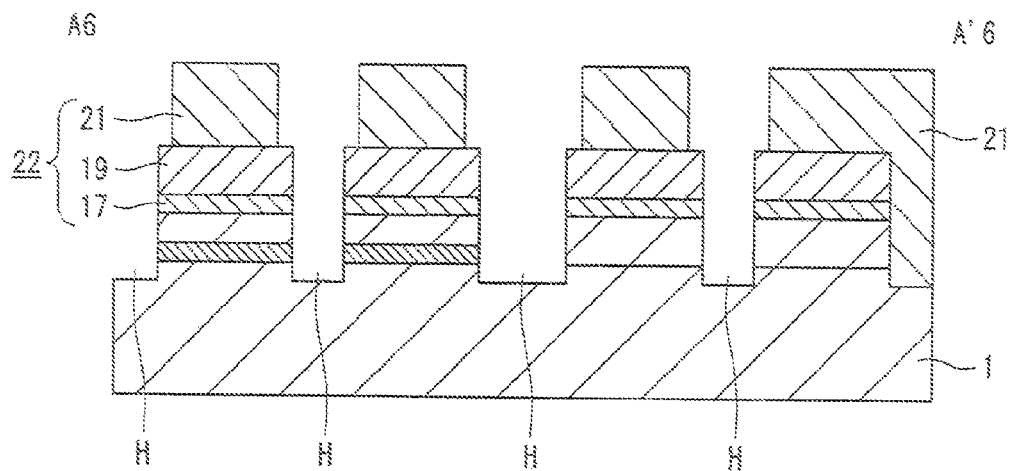
Figure 6C:
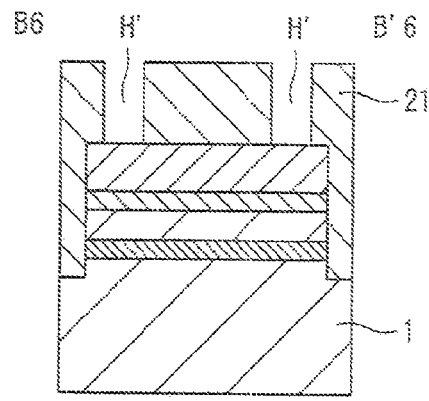

Next, as shown in FIGS. 5A and 5B, a $SiO_2$ film 21 is formed on the whole surface of the Si substrate 1 so as to fill the depressed portion h. The $SiO_2$ film 21 is formed by CVD, for example. Referring now to FIGS. 6A through 6C, the $SiO_2$ film 21 is partially etched by photolithography and etching, forming a support body 22 made up of the $SiO_2$ film 21, the $Si_3N_4$ film 19, and the $SiO_2$ film 17, while forming a groove H to expose the surface of the Si substrate 1. Here, the groove H in the SOI region serves as an inlet of an etchant when the SiGe layer 11 is etched in a step later.

In the step to etch the $SiO_2$ films 17 and 21, the $Si_3N_4$ film 19 functions as an etching mask. Meanwhile, in a region already having the depressed portion h formed in the previous step, the depressed portion h buried with the $SiO_2$ film 21 is exposed and the surface of the Si substrate 1 is revealed, forming the groove H as a new groove. Therefore, in a region in which the depressed portion h and the groove H are overlapped, the groove H is self-alignmently formed due to the $Si_3N_4$ film 19. Further, a size of the groove H is defined only by a processing dimension of the depressed portion h. In the step to form the groove H, etching may he performed until reaching the surface of the Si substrate 1, or the substrate 1 may be overetched to form a concave thereon. In addition to the above, as shown in FIGS. 6A and 6C, a groove IF is also formed in the $Si_3N_4$ film in the SOI region in the etching step of the $SiO_2$ film 21.

Figure 7A:
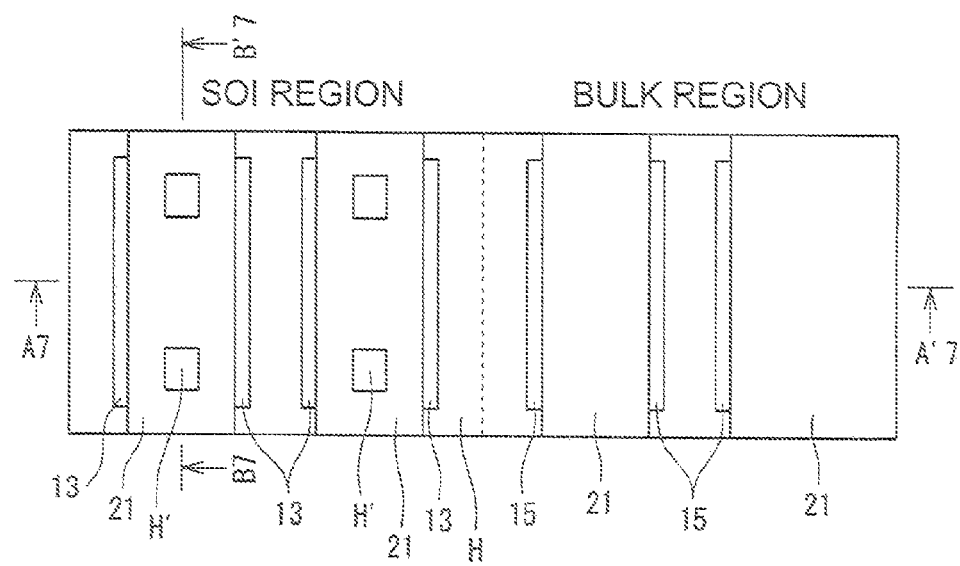
FIGS. 7A through 7C are diagrams illustrating the method for manufacturing a semiconductor device according to the embodiment.
Figure 7B:
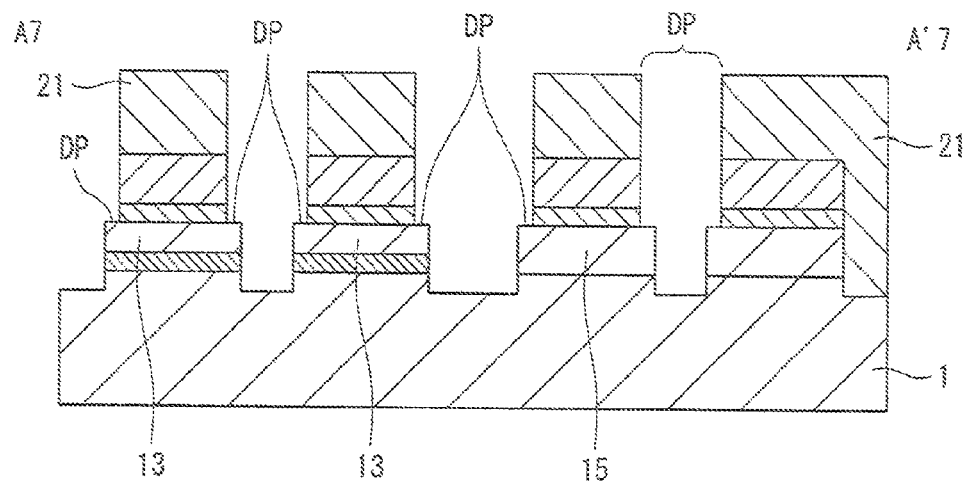
Figure 7C:
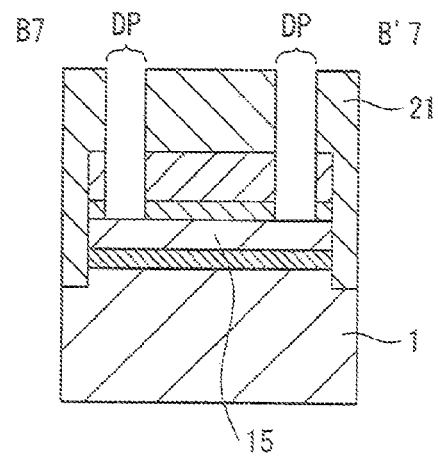

Next, as shown in FIGS. 7A through 7C, the $Si_3N_4$ film 19 and the $SiO_2$ film 17 inside of the grooves H and H' are sequentially etched so as to expose a surface of the Si layer 13 in the grooves H and H'. Here, for example, the $Si_3N_4$ film 19 is etched by dry etching or wet etching using heated phosphoric acid while the $SiO_2$ film 17 is etched by wet etching using a dilute HF solution, for example. Surfaces of the Si layers 13 and 15 and the surface of the Si substrate 1, which are exposed inside of the groove H and H', are a dummy pattern DP to assure a contact interface between Si and an etchant broadly when the SiGe layer 11 is etched.

Figure 8A:
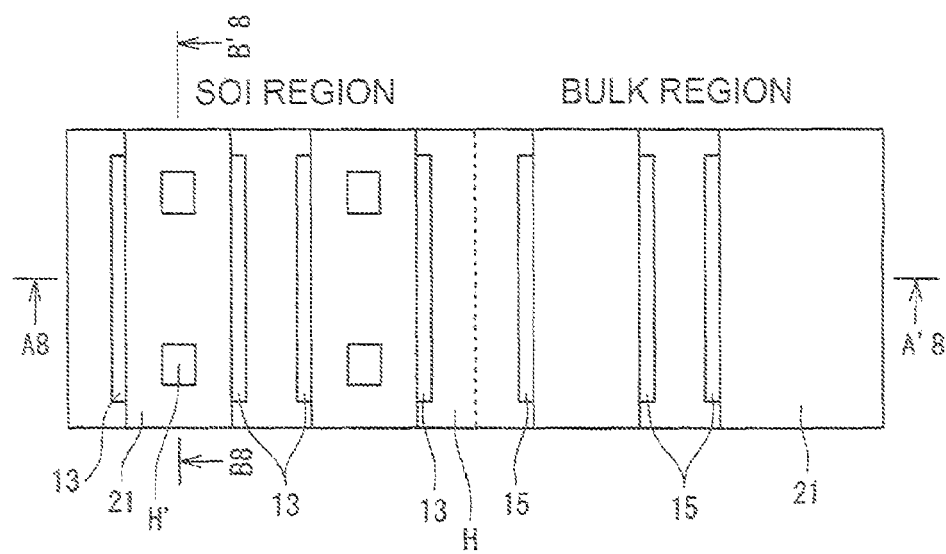
FIGS. 8A through 8C are diagrams illustrating the method for manufacturing a semiconductor device according to the embodiment.
Figure 8B:
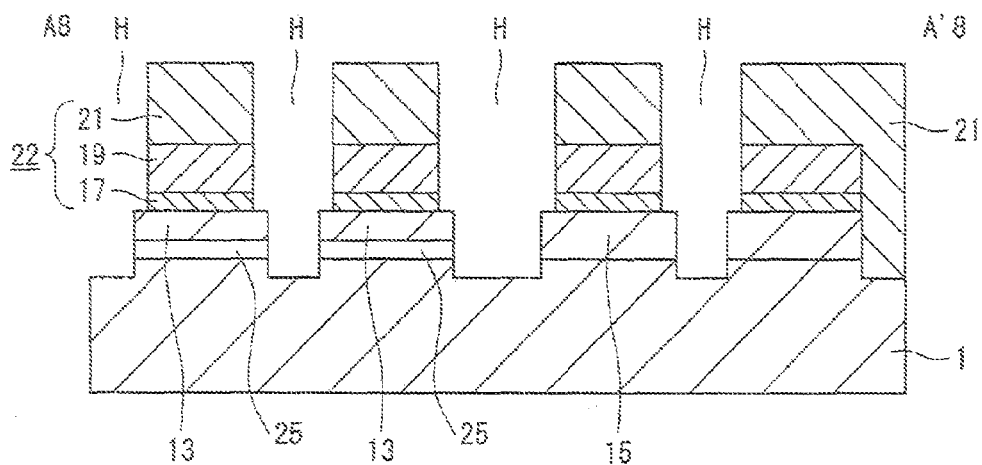
Figure 8C:
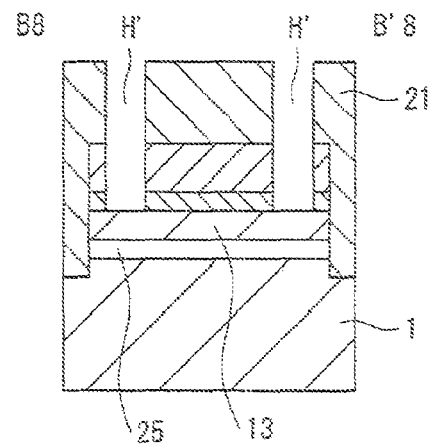

Then, the SiGe layer 13 and the SiGe layer 11 are etched by contacting an etchant such as a hydrofluoric-nitric acid solution with respective sides thereof through the groove H, selectively removing the SiGe layer 11. Accordingly, a cavity 25 is formed between the Si layer 13 and the Si substrate 1 as shown in FIGS. 8A through 8C. In wet etching using a hydrofluoric-nitric acid solution, since an etching rate of SiGe is higher than that of Si, (that is, the etching rate with respect to Si is high), only the SiGe layer 11 is removed by etching, while the Si layer 13 remains. After the cavity 25 is formed, a top surface and a side surface of the Si layer 13 are supported by the support body 22.

Figure 10:
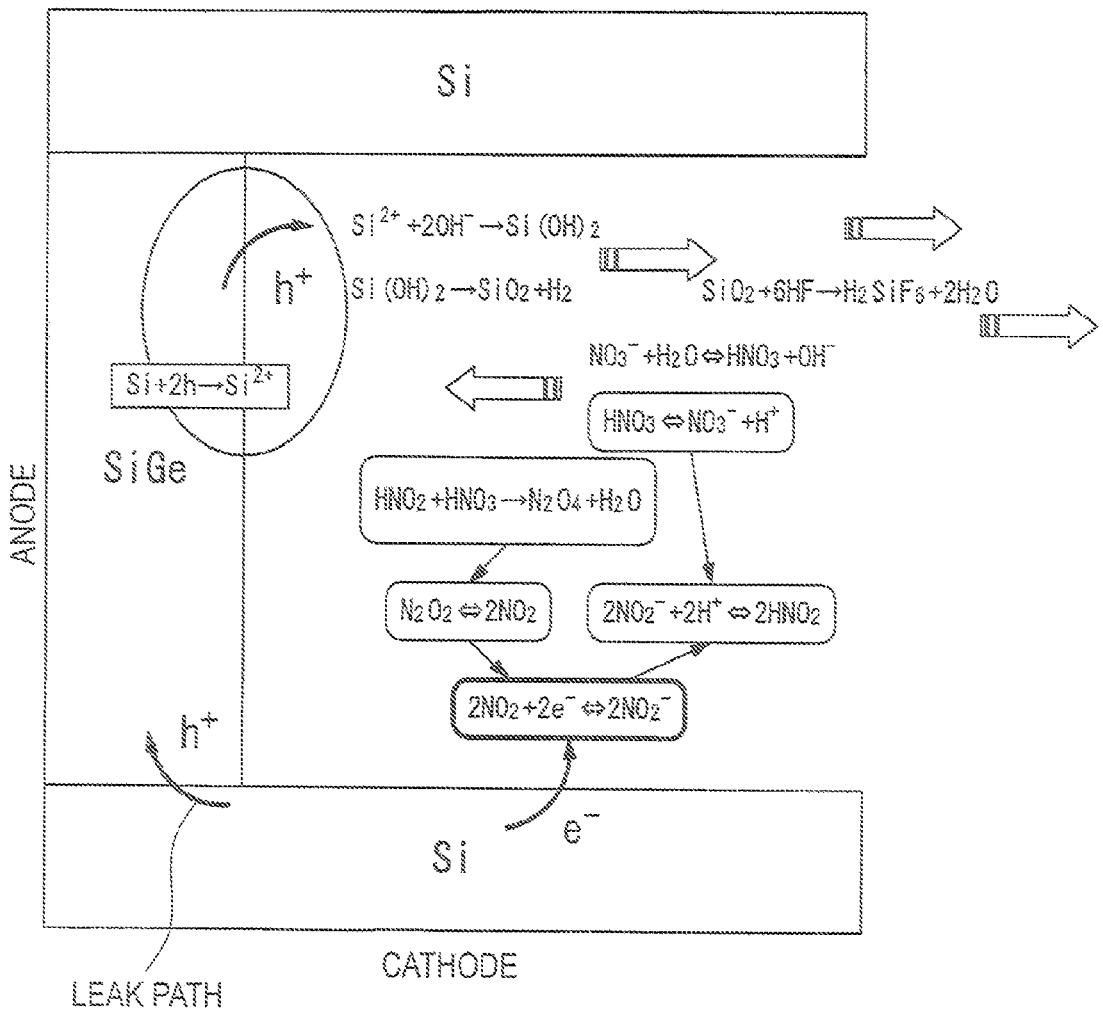
FIG. 10 is a diagram showing an etching mechanism of a SiGe layer that the inventors have found.
Figure 11:
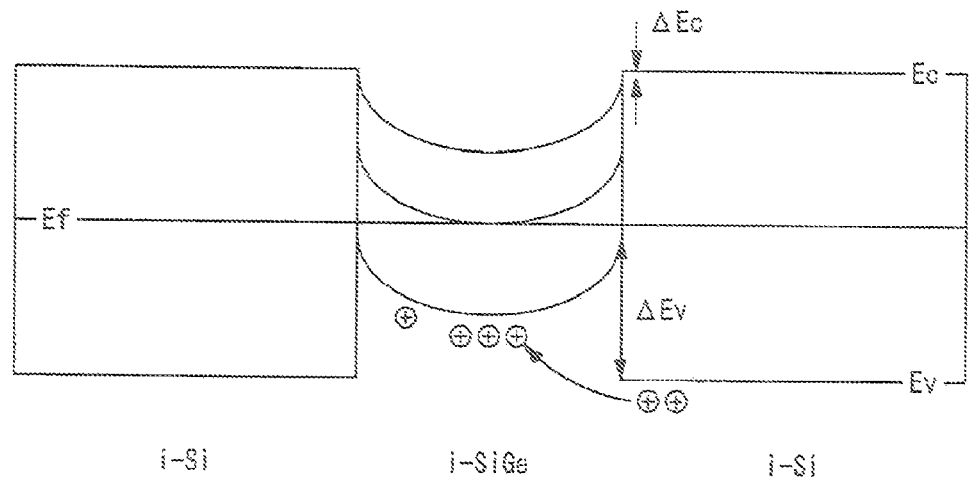
FIG. 11 is a diagram showing a difference in energy level between SiGe and i-Si.

In the step to etch the SiGe layer 11, the surfaces of the Si layers 13 and 15 are exposed in the grooves H and H' (that is, served as a dummy pattern), making the contact interface between Si and the etchant sufficiently broad. Accordingly, as shown in FIG. 10, an electric current (hole $h^+$) required to etch the SiGe layer can circulate through the etchant, the Si substrte (or the Si-buffer layer), the SiGe layer, the etchant, and so on in this order, thereby preventing the etching selectivity from deteriorating.

Next, as shown in FIGS. 8A through 8C, the Si substrate 1 is thermally oxidized, forming a $SiO_2$ film (not shown) in the cavity 25. Then, after the cavity 25 is buried with a $SiO_2$ film or the like, an insulating film is formed on the whole surface of the Si substrate 1 by CVD or the like so as to fill the grooves H and H'. The insulating film, for example, is a $SiO_2$ film or a silicon nitride ($Si_3N_4$) film. In a case when the cavity 25 is not completely filled with the $SiO_2$ film, the insulating film formed as above can complete filling the cavity 25. Thereafter, the insulating film covering the whole surface of the Si substrate 1 is planarized by chemical mechanical polishing (CMP), for example. Further, the insulating film is wet etched if necessary.

Accordingly, the insulating film is completely removed from the Si layers 13 and 15, thereby completing an SOI structure on the Si substrate 1 in the SOI region. After the SOI structure is formed on the Si substrate 1, an SOI device may be formed on the Si layer 13 in the SOI region, while a bulk silicon device may be formed on the Si layer 15 in the bulk region, for example.

Figure 9:
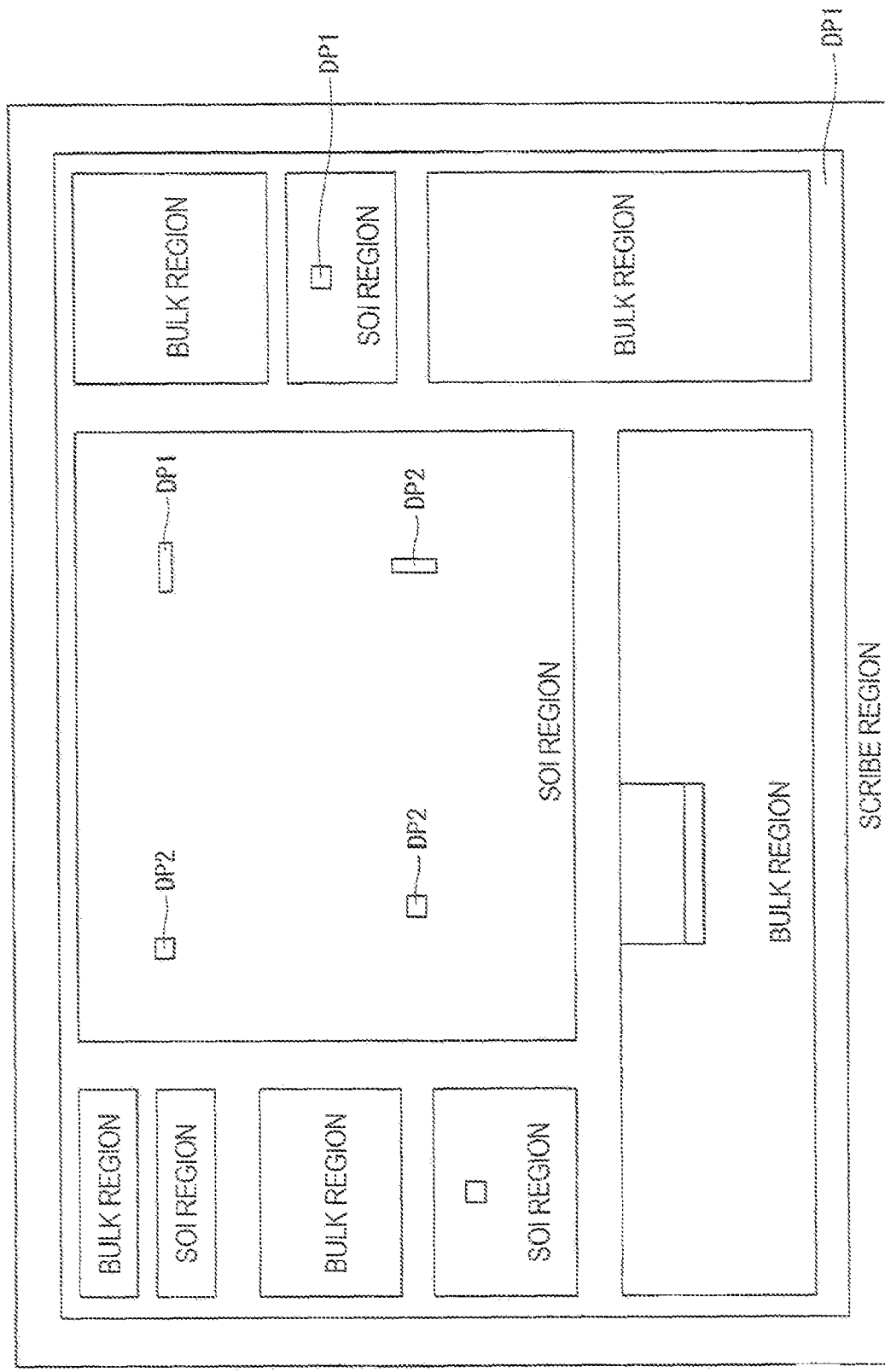

FIG. 9 is a plan view showing an example configuration of the SOI region, the bulk region, and the dummy patterns DP1, and DP2. FIG. 9 shows the example configuration in which a dummy pattern formed in the groove H is DP1 while a dummy pattern formed in the groove H' is DP2. The dummy pattern DP1 has a bottom surface that is the surface of the Si substrate 1. Therefore, as shown in FIG. 9, the dummy pattern is arranged in an element isolation region lying between the bulk region and the SOI region, further, also can be arranged in a part of the bulk region and the SOI region. In addition, the dummy pattern DP1 can be arranged in a scribe (line) region although it is not shown. Meanwhile, the dummy pattern DP2 has a bottom surface that is the Si layer 13, thereby being arranged in the SOI region as shown in FIG. 9.

As the above, according to the embodiment of the invention, the dummy patterns DP, DP1, and DP2 are provided, thereby making the contact interface between Si and a hydrofluoric-nitric acid solution sufficiently broad while circulating an electric current (hole $h^+$) required to etch the SiGe layer 11 through the etchant, the Si substrate (or the Si-buffer layer), the SiGe layer, the etchant, and so on in this order. Consequently, the oxidation number of the SiGe layer 11 with respect to the Si layers 13 and 15 is maintained high while the etching selectivity is prevented from deteriorating.

Therefore, for example, even when differences in area and density between the plane patterns of the SOI layer 13 are large, the etching selectivity of the SiGe layer 11 with respect to the SOI layer 13 is prevented from deteriorating. Further, even when an etching time with the hydrofluoric-nitric acid solution is long, a speed to etch the SOI layer 13 is prevented from increasing. Therefore, the SOI layer 13 with a large area having a stable shape and an even film thickness, and the SOI layer 13 in various shapes are formed with high yields. As the above, the method can contribute to improving a process yield and stabilizing electrical characteristics of a semiconductor having various devices such as a bulk silicon device, an SOI device and the like mounted in combination.

A chemical solution (i.e. etchant) to etch the SiGe layer 11 is not limited to the hydrofluoric-nitric acid solution in the invention. As the etchant above, a mixed solution including $CH_3COOH$, HF, $HNO_3$ and $H_2O$ can be used, for example. Such etchant also can remove only the SiGe layer 11 while leaving the Si layer 13 because the etching rate of SiGe is higher than that of Si.

Further, the etchant above is preferably used at a temperature of 50 degrees centigrade or more. For example, the hydrofluoric-nitric acid solution Is heated to be 50 degrees centigrade or more inside or outside of an etching apparatus. Then the hydrofluoric-nitric acid solution is supplied to the surface of the Si substrate 1 before the temperature thereof decreases below 50 degrees centigrade so as to etch and remove the SiGe layer. Further, it is preferable that not only the etchant, but also the Si substrate 1 be heated to be 50 degrees centigrade or more so that the SiGe layer is etched before the temperature thereof decreases below 50 degrees centigrade. As the above, the temperatures of the etchant and the Si substrate 1 are controlled, enabling a larger electric current to be supplied either in a forward direction or a reverse direction at an interface between SiGe and Si substrate 1. Therefore, the large electric current can circulate through the etchant, the Si substrate (or the Si-buffer layer), the SiGe layer, the etchant, and so on in this order.

Further, a plurality of constituents included in the etchant above is preferably stored in a single state. Then, when the SiGe layer 11 is etched, the constituents each stored in a single state are mixed immediately before etching (within five minutes) so as to make the etchant, and the etchant is adjusted to he at a predetermined temperature. The SiGe layer is thus favorably etched by the etchant at the temperature adjusted as above. According to the above, the etchant is prevented from deteriorating. Further, when the constituents stored in a single state (e.g. $CH_3COOH$, HF, $HNO_3$ and $H_2O$) are mixed, a temperature of the mixed solution rises to 40 to 50 degrees centigrade. Therefore, when the mixed solution is controlled to be at a temperature of 50 degrees centigrade or more, an amount of heat required for heating is reduced, so that an energy saving effect is expected.

Furthermore, when the SiGe layer 11 is etched, a wet spin etched can be used instead of a wet station employing a dip method. The wet spin etcher sprays an etchant on the surface of the Si substrate 1 while rotating it. When the wet spin etcher is used, liquids such as the hydrofluoric-nitric acid solution, pure water, a dilute HF solution (or a hydrogen peroxide solution), pure water, the hydrofluoric-nitric acid solution, pure water and so on are alternately supplied in this order from a nozzle toward the surface of the Si substrate 1 rotating so as to etch the SiGe layer 11. According to the above method, for example, before concentration of nitrous acid in the hydrofluoric-nitric acid solution is increased, an old hydrofluoric nitric acid solution is removed once from the surface of the Si substrate 1. Thereafter, the hydrofluoric-nitric acid solution newly formed is supplied again to the surface of the Si substrate 1 to etch the SiGe layer. Therefore, a concentration of nitrous acid in the hydrofluoric-nitric acid solution and a product generated by etching are easily maintained to be less than or equal to a constant concentration, more assuredly preventing the etching selectivity from deteriorating and preventing a speed to etch the Si layer from increasing.

[Comparison to a Method for Manufacturing a Semiconductor Device in Related Art]

In the manufacturing method in related art, when SiGe is selectively etched, a bulk region is entirely covered with an insulating film. For example, in FIGS. 7A through 7B, the dummy pattern DP is not formed and a whole of the bulk region is covered with the $SiO_2$ film. At this time, the $SiO_2$ film is slightly etched, and even when a concentration of HF is reduced, electrons are not exchanged between the hyrdrofluoric-nitric acid solution and the Si substrate (or a Si layer) in the bulk region. Further, when a surface of the scribe line at an interface between the SOI region and the bulk region is covered with the insulating film, similarly electrons are not exchanged. Therefore, in the manufacturing method in related art, it is hard to secure an electric current at an interface between the Si layer and the solution, and an interface between the Si substrate and the solution in the SOI region adjacent to the scribe line or the SOI region surrounded by the bulk region. As a result, holes ($h^+$) are not supplied to the SiGe layer, slowing clown the etching rate of the SiGe.

Further, in the manufacturing method in related art, an area of the SOI layer (that is, an area of the SiGe layer to be etched by a hydrofluoric-nitric acid solution or the like) becomes large in an SOI device having a high withstand voltage and an SOI device region having a large electric current. Compared to this, when an area of the groove H becomes relatively small, it is hard to secure an electric current at the interfaces between the Si layer and the solution, and between the Si substrate and the solution, slowing down the etching rate of the SiGe.

On the other hand, according to the embodiment of the invention, the dummy patterns DP, DP1, and DP2 are formed so as to expose the surface of Si in the SOI region, the bulk region, and the like, thereby making the contact interface between Si and the hydrofluoric-nitric acid solution sufficiently broad when the SiGe layer 11 is etched. Further, the electric current (hole $h^+$) required for etching the SiGe layer 11 can circulate through the etchant, the Si substrate (or Si-buffer), the SiGe layer, the etchant, and so on in this order. Because of the above, the etching rate of the SiGe layer is maintained high, preventing a speed to etch Si from increasing.

In the embodiment, a case where each one of the SiGe layer 11 and the Si layer 13 is layered is explained. However, the invention is not limited to this. It is also applicable to a method for manufacturing a semiconductor device in which a plurality of the SiGe layers and the Si layers are alternately layered, for example.

What is claimed is:

1. A method of manufacturing a semiconductor device that includes a Si substrate having a first region and a second region, the method comprising:
    forming a SiGe layer on the first region of the Si substrate;
    forming a first Si layer on the SiGe layer;
    forming a first $SiO_2$ layer on the first Si layer;
    forming a $Si_3N_4$ layer on the first $SiO_2$ layer;
    etching a part of the $Si_3N_4$ layer, the $SiO_2$ layer, and the SiGe layer to form a depressed portion that exposes a side surface of the SiGe layer;
    forming a second $SiO_2$ layer over the Si substrate such that the second $SiO_2$ layer is filled in the depressed portion;
    forming a first groove that exposes a surface of the substrate by etching a part of the first and second $SiO_2$ layers and the $Si_3N_4$ layer;
    forming a second groove that reaches a part of the $Si_3N_4$ layer by etching another part of the second $SiO_2$ layer;
    etching the $Si_3N_4$ layer and the first $SiO_2$ layer inside the first and second grooves to expose a surface of the first Si layer; and
    etching the SiGe layer to form a cavity by applying an etchant to the first Si layer and the SiGe layer via the first groove.

2. The method of manufacturing the semiconductor device according to claim 1, the first region being a SOI region and the second region being a bulk region.

3. The method of manufacturing the semiconductor device according to claim 1, further comprising:
    forming a third $SiO_2$ layer in the cavity by a thermal oxidization method.

4. The method of manufacturing the semiconductor device according to claim 1, further comprising:
    forming a second Si layer on the second region of the Si substrate;
    forming the first $SiO_2$ layer on the second Si layer;
    forming the $Si_3N_4$ layer on the first $SiO_2$ layer; and
    etching the $Si_3N_4$ layer to expose a part of the second Si layer.

5. The method of manufacturing the semiconductor device according to claim 1, the first groove being formed in an element isolation region sandwiched by the first region and the second region.

6. The method of manufacturing the semiconductor device according to claim 1, the surface of the Si layer and the surface of the Si substrate formed in the first groove being dummy patterns configured to provide a broad contact interface between the Si and the etchant when the SiGe layer is etched.

7. The method of manufacturing the semiconductor device according to claim 1, the etching of the SiGe layer being conducted such that an electric current required to etch the SiGe layer circulates through an order of the etchant, the Si substrate/layer, and the SiGe layer.

8. The method of manufacturing the semiconductor device according to claim 1, the forming of the first groove and the forming of the second groove being conducted in the same process.

9. The method of manufacturing the semiconductor device according to claim 1, the etchant being a mixed solution including $HNO_3$, $H_2O$ and one of HF and $NH_4F$ and the etchant being provided at the SiGe layer and the first Si layer within the first groove at a temperature of equal to or greater than 50 degrees centigrade.

10. The method of manufacturing the semiconductor device according to claim 1, the etchant being a mixed solution including $CH_3COOH$, $HNO_3$, $H_2O$, and one of HF and $NH_4F$.

11. The method of manufacturing the semiconductor device according to claim 1, the etching of the SiGe layer being conducted by alternately supplying the etchant and one of pure water, a diluted HF solution, and a hydrogen peroxide solution from a nozzle toward the surface of the Si substrate that is rotating.

12. The method of manufacturing the semiconductor device according to claim 1, the etching of the SiGe layer being conducted while the Si substrate is heated to a temperature equal to or greater than 50 degrees centigrade.

* * * * *